(12) United States Patent
Bernstein et al.

(10) Patent No.: US 7,913,193 B2
(45) Date of Patent: *Mar. 22, 2011

(54) DETERMINING RELATIVE AMOUNT OF USAGE OF DATA RETAINING DEVICE BASED ON POTENTIAL OF CHARGE STORING DEVICE

(75) Inventors: Kerry Bernstein, Underhill, VT (US); Kenneth J. Goodnow, Essex Junction, VT (US); Clarence R. Ogilvie, Huntington, VT (US); Sebastian T. Ventrone, South Burlington, VT (US); Keith R. Williams, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 408 days.

This patent is subject to a terminal disclaimer.

(21) Appl. No.: 11/924,935

(22) Filed: Oct. 26, 2007

(65) Prior Publication Data

US 2009/0109781 A1 Apr. 30, 2009

(51) Int. Cl.
*G06F 17/50* (2006.01)

(52) U.S. Cl. ............... 716/1; 716/4; 716/5; 365/189.07; 365/189.08; 365/189.09; 365/201; 365/210.11; 365/210.12; 365/210.13; 365/210.14; 365/210.15; 365/222; 365/226; 365/229; 365/230.05

(58) Field of Classification Search ............... 716/4–5, 716/1; 365/201, 210.11–210.15, 226–229, 365/222, 230.05, 189.07–189.09

See application file for complete search history.

(56) References Cited

U.S. PATENT DOCUMENTS

| | | | |
|---|---|---|---|
| 4,743,864 A | 5/1988 | Nakagawa et al. | |
| 4,843,300 A | 6/1989 | Alderman | |
| 5,652,729 A * | 7/1997 | Iwata et al. | 365/222 |
| 5,777,347 A | 7/1998 | Bartelink | |
| 6,075,739 A * | 6/2000 | Ihara | 365/222 |
| 6,266,722 B1 | 7/2001 | Ogura | |
| 6,548,848 B2 | 4/2003 | Horiguchi et al. | |
| 6,720,619 B1 | 4/2004 | Chen et al. | |
| 7,103,522 B1 | 9/2006 | Shepard | |
| 7,352,611 B2 * | 4/2008 | Isoda et al. | 365/154 |
| 7,397,718 B2 * | 7/2008 | Bernstein et al. | 365/222 |
| 2002/0038888 A1 | 4/2002 | Kadowaki et al. | |
| 2002/0186572 A1 | 12/2002 | Nishida et al. | |
| 2003/0078763 A1 | 4/2003 | Chuang et al. | |
| 2005/0040881 A1 | 2/2005 | Brown et al. | |
| 2005/0218942 A1 | 10/2005 | Yamashita | |
| 2005/0248976 A1 | 11/2005 | Huang et al. | |

(Continued)

OTHER PUBLICATIONS

Yang, Han, U.S. Appl. No. 11/924,955, Office Action, Mar. 22, 2010, 16 pages.

(Continued)

*Primary Examiner* — Nghia M Doan
(74) *Attorney, Agent, or Firm* — Michael J. LeStrange; Hoffman Warnick LLC

(57) ABSTRACT

An integrated circuit and a design structure are disclosed. An integrated circuit may comprise: a data retaining device; a charge storing device coupled to the data retaining device such that a use of the data retaining device triggers a charging of the charge storing device by a charge source; and means for measuring a potential of the charge storing device, the measuring means being communicatively coupled to a calculating mean which determines a relative amount of usage of the data retaining device based on the measured potential.

3 Claims, 5 Drawing Sheets

U.S. PATENT DOCUMENTS

2007/0198808 A1* 8/2007 Bernstein et al. .................. 712/1
2007/0242507 A1 10/2007 Bernstein et al.
2009/0287905 A1 11/2009 Bernstein et al.

OTHER PUBLICATIONS

Yang, Han, U.S. Appl. No. 11/924,955, Notice of Allowance, May 5, 2010, 10 pages.

Yang, Han, U.S. Appl. No. 11/279,507, Office Action, Dec. 14, 2007, 30 pages.

Yang, Han, U.S. Appl. No. 11/279,507, Notice of Allowance, Jun. 30, 2008, 17 pages.

Yang, Han, U.S. Appl. No. 12/180,776, Notice of Allowance, Aug. 4, 2009, 9 pages.

Yang, Han, U.S. Appl. No. 12/180,776, Amendment to Office Action, Jul. 28, 2008, 7 pages.

Luu, Pho M., U.S. Appl. No. 12/045,744, Office Action, Jun. 9, 2010, 13 pages.

Luu, Pho M., U.S. Appl. No. 11/279,639, Notice of Allowance, Dec. 17, 2007, 12 pages.

Pan, Daniel H., U.S. Appl. No. 11/276,236, Office Action, May 25, 2010, 12 pages.

Pan, Daniel H., U.S. Appl. No. 11/276,236, Notice of Allowance, Jun. 23, 2010, 7 pages.

Yang, Han, U.S. Appl. No. 12/180,776, Office Action, Mar. 19, 2009, 9 pages.

* cited by examiner

DETERMINING RELATIVE AMOUNT OF USAGE OF DATA RETAINING DEVICE BASED ON POTENTIAL OF CHARGE STORING DEVICE

The current application is related to co-pending U.S. patent application Ser. No. 11/279,639, currently pending.

BACKGROUND OF THE DISCLOSURE

1. Technical Field

The disclosure relates generally to a usage of a data retaining device, and more particularly, to a method and system for determining a relative amount of usage of a data retaining device based on a potential of a charge storing device coupled to the data retaining device.

2. Background Art

An amount of usage of a data retaining device needs to be determined for various applications. For example, a multi-port cache is usually limited in size so that if the cache is full, some of the ports/word lines of the cache need to be refreshed to make room for new items. A cache replacement algorithm is usually used to select word lines to refresh. Examples of cache replacement algorithms include a Least Recently Used (LRU) algorithm which refreshes the least recently used word line first, and a Least Frequently Used (LFU) algorithm which refreshes the least frequently used word line first. These algorithms require keeping track of usage of a word line of the cache, which is very costly under the present state of the art technology.

Based on the above, there is a need in the art for a solution to determine a usage of a data retaining device in an inexpensive/efficient way.

SUMMARY OF THE DISCLOSURE

A first aspect of the disclosure provides a design structure embodied in a machine readable medium used in a design flow process, the design structure comprising a circuit, the circuit comprising: a data retaining device; a charge storing device coupled to the data retaining device such that a use of the data retaining device triggers a charging of the charge storing device by a charge source; and means for measuring a potential of the charge storing device, the measuring means being communicatively coupled to a calculating mean which determines a relative amount of usage of the data retaining device based on the measured potential.

A second aspect of the disclosure provides an integrated circuit comprising: a data retaining device; a charge storing device coupled to the data retaining device such that a use of the data retaining device triggers a charging of the charge storing device by a charge source; and means for measuring a potential of the charge storing device, the measuring means being communicatively coupled to a calculating mean which determines a relative amount of usage of the data retaining device based on the measured potential.

The illustrative aspects of the present disclosure are designed to solve the problems herein described and/or other problems not discussed.

DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements among the drawings.

DETAILED DESCRIPTION

1. System Overview

Figure 1:
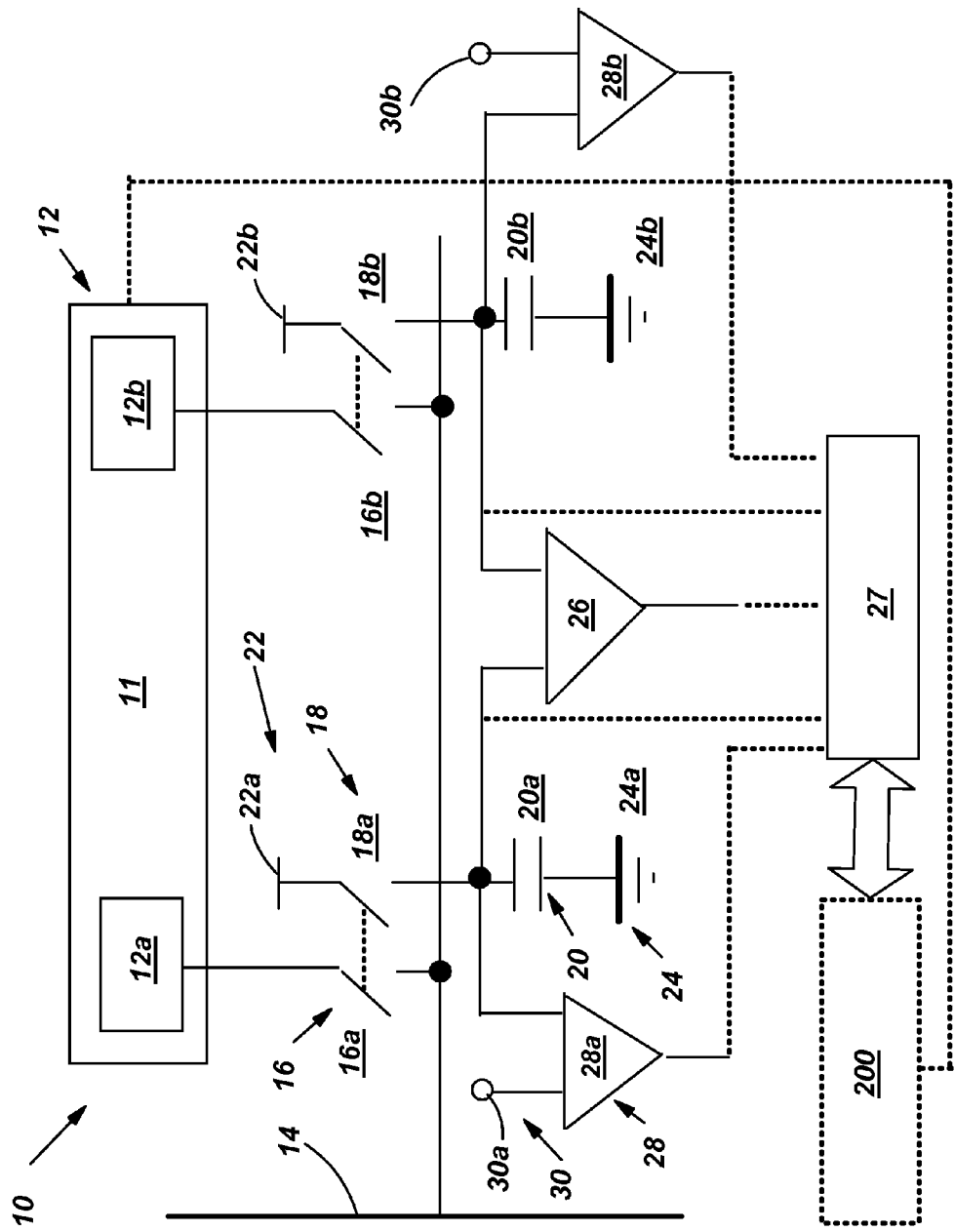
FIG. 1 shows a schematic diagram of a system for determining a relative amount of usage of a data retaining device according to one embodiment of the disclosure.

FIG. 1 shows a schematic diagram of one embodiment of a system 10 for determining a relative amount of usage of a data retaining device 12. As shown in FIG. 1, data retaining sub-system 11, e.g., a multi-port cache, includes multiple data retaining devices 12 (two are shown, 12a, 12b), e.g., ports/word lines of cache 11. Each data retaining device 12 is coupled to a data access line 14 through a switch 16 (16a, 16b, respectively). Each switch 16 is controlled/designed to act consistently with a corresponding switch 18 (18a, 18b, respectively). According to one embodiment, specifically, a switch 16 and a corresponding switch 18 turn ON/OFF at substantially the same time, which is illustrated by a dotted line linking switches 16 and 18. It should be appreciated that an activity of a switch 18 may be delayed from an activity of the corresponding switch 16, which is controllable and is included in the current disclosure. It should be appreciated that switches 16 and 18 may include any mechanisms that control a connection and a disconnection between two components of a circuit.

A charge storing device 20, e.g., capacitor (20a, 20b), is couple between a charge source 22 (22a, 22b, respectively), e.g., a positive voltage supply (VDD), and a ground 24 (24a, 24b, respectively) through a switch 18 (18a, 18b, respectively). Charge sources 22 may vary in value depending on, e.g., a weighting assigned to them, as will be described later. As such, in the following description, a charge source 22 will be referred to as a weighted charge source (WCS) 22. Potentials, e.g., voltages, of capacitors 20 may be fed to comparator 26 as inputs to be compared therein.

The potential of a capacitor 20 and an output, e.g., a comparison result, of comparator 26 may be measured/obtained by a measuring device 27. It is appreciated that measuring device 27 may include any mechanism[s] that is capable of measuring capacitor 20 potential and/or comparator 26 output.

In operation, when a data retaining device 12, for example, 12a, is accessed/used through data access line 14, with switch 16a being turned on, the corresponding switch 18a is also turned on, which enables a charging of capacitor 20a by weighted charge source 22a. As such, each use of data retaining device 12a triggers a charging of capacitor 20a, which causes an increase in the potential, e.g., voltage, of capacitor 20a. On the other hand, during a period that data retaining device 12a idles, with switches 16a and 18a being turned off, charges on capacitor 20a decay due to natural means, which causes a decrease in the voltage of capacitor 20a. As a consequence, capacitor 20a is functionally coupled to data retaining device 12a through the correspondence between switches 16a and 18a, and the potential, e.g., voltage, of capacitor 20a may be used as an indicator of an amount of usage of data retaining device 12a. In addition, a comparison of the potentials of capacitors 20a and 20b may be a basis for determining a relative amount of usage of data retaining device 12a compared to data retaining device 12b. For example, a lower potential of capacitor 20a than that of capacitor 20b may indicate that data retaining device 12a has been less used than data retaining device 12b, and may be a candidate for a refresh to make room for new data items. In the following description, a voltage of a capacitor 20 will be used as an example of a potential of the same, for illustrative purposes. Please note, as a certain use of data retaining device 12a causes a fixed amount of charges to be injected onto capacitor 20a, the voltage of capacitor 20a is mainly determined by the amount of usage of data retaining device 12a and the initial voltage of the same. That is, in a given period, the exact time when a use of data retaining device 12a occurs does not make significant difference. As such, the current disclosure may be used with, inter alia, a Least Frequently Used algorithm for replacing cache.

According to one embodiment, a data retaining devices 12, e.g., 12a, may be prioritized so that for the same amount of usages of data retaining devices 12a, 12b, capacitors 20a, 20b, respectively, may end with different voltage values. Various methods may used to achieve a priority. For example, the amount of charge injected onto a capacitor 20 may be controlled to reflect a priority of a data retaining device 12. For example, the sizes of weighted charge sources 22 coupled to each data retaining device 12 may be tuned/weighed to achieve injection of different charges onto different capacitors 20 for the same usage of data retaining devices 12. In addition, a decay rate of a capacitor 20 may be tuned/processed to reflect the priority of the related data retaining device 12. For example, if data retaining device 12a has a priority over data retaining device 12b, capacitor 20a may be tuned to decay more slowly than capacitor 20b.

As is appreciated, a capacitor 20 may be charged to an upper level such that the voltage of the capacitor 20 is no longer sensitive to further charging. In addition, a voltage of a capacitor 20 may decay to a lower level such that the voltage is no longer sensitive to further decay. As such, actions need to be taken to make sure that the voltage of a capacitor 20 has not reach the upper level or the lower level so that the voltage is valid to indicate a relative amount of usage of the related data retaining device 12. That is, a comparison in comparator 26 needs to yield a valid result. According to one embodiment, voltage of a capacitor 20 (here 20a, 20b) may be input into a comparator 28 (28a, 28b, respectively) to be compared with a signal 30 (30a, 30b, respectively). A signal 30 may be controlled to represent a minimum voltage for a capacitor 20 to maintain sensitivity to further decay or a maximum voltage for the capacitor 20 to maintain sensitivity to further charging.

In addition, a voltage level of a capacitor 20 may indicate the validity of data in data retaining device 12. For example, if the voltage of a capacitor 20 has decayed for a long time, the data stored in a data retaining device 12 may have also decayed to be invalid. As such, signal 30 may also be controlled to represent a minimum voltage level of a capacitor 20 to make sure that data stored in a data retaining device 12 is still valid.

A computer system 200 may be responsive to system 10. For example, computer system 200 may control measuring device 27 in performing measurements, and may receive the measurement results as data inputs. Upon processing these data inputs, computer system 200 may control an action on a data retaining device 12 of data retaining sub-system 11.

Figure 2:
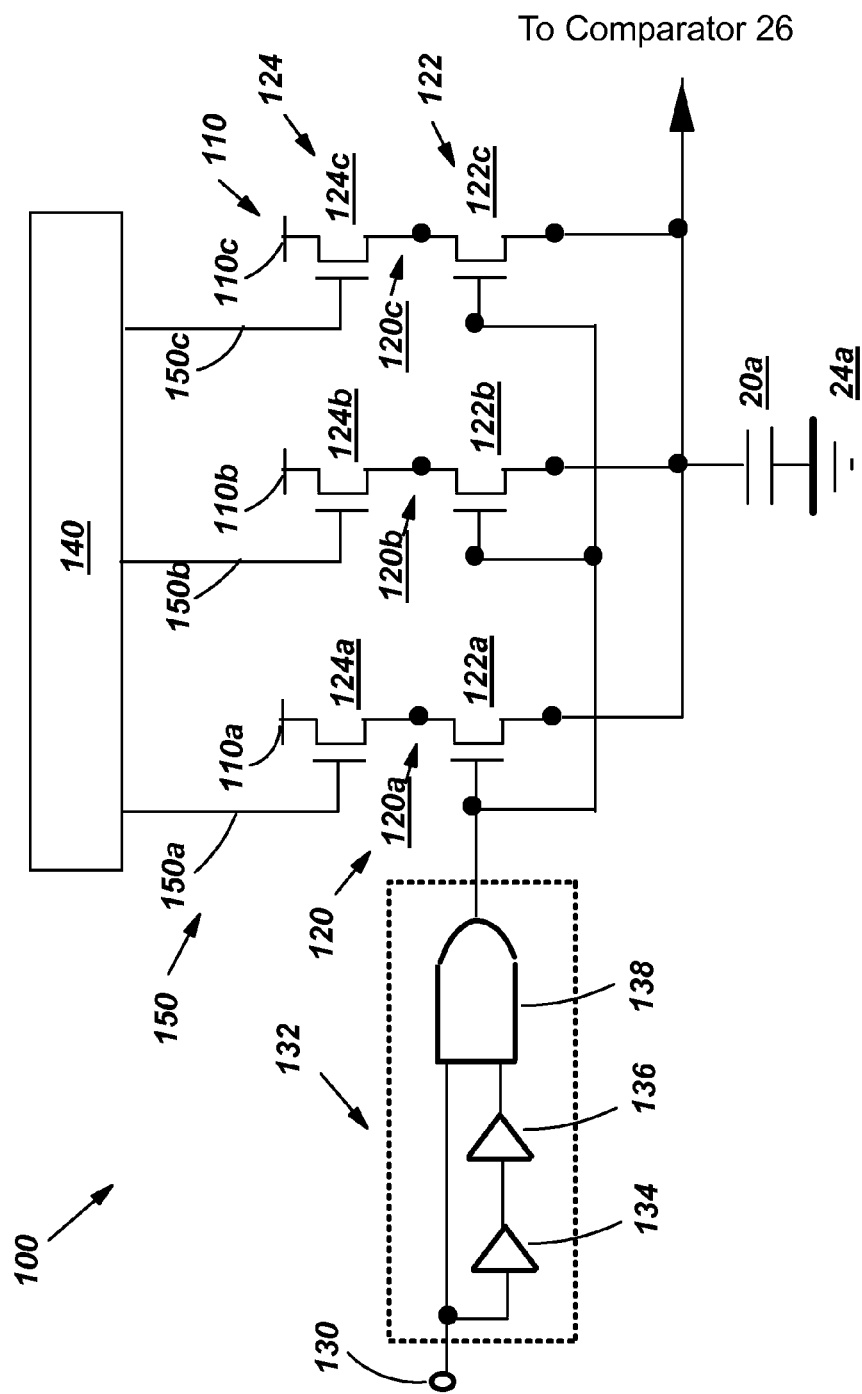
FIG. 2 shows one embodiment of a hardware implementation of the disclosure with respect to one data retaining device.

FIG. 2 shows one embodiment of a hardware implementation 100 of the disclosure regarding one data retaining device, e.g., 12a (FIG. 1). As shown in FIG. 2, capacitor 20a is coupled to multiple weighted charge sources 110 (110a, 110b, 110c) through transistor stacks 120 (120a, 120b, 120c, respectively). Please note, weighted charge sources 110 are collectively referred to as weighted charge source 22a in FIG. 1. Each transistor stack 120 includes a transistor 122 (122a, 112b, 122c, respectively) and a transistor 124 (124a, 124b, 124c, respectively). A control signal 130 is coupled to the gates of transistors 122 through a one-shot-generator 132 including buffers 134, 136 and a latch 138. Outputs 150 (150a, 150b, 150c) of an address comparator 140 are coupled to the gates of transistors 124 (124a, 124b, 124c, respectively).

In operation, control signal 130 and outputs 150 (150a, 150b, 150c) of address comparator 140 are used together to achieve the correspondence between switches 16 and 18 (FIG. 1). Control signal 130 may be activated upon each selection of a data retaining device 12, e.g., 12a, of data retaining sub-system 11, e.g., a multi-port cache (FIG. 1). Control signal 130 may then be processed by one-shot-generator 132 to generate a signal to control the gates of transistors 122 (122a, 122b, 122c). As such, transistors 122 may be turned on by control signal 130 when data retaining device 12a is selected for a use (whatever type). Each output 150 represents a specific type of use of data retaining device 12a (FIG. 1). For example, output 150a may represent a "WRITE" action; output 150b may represent a "READ" action; and output 150c may represent an "ACCESS" action. As such, a transistor 124 may be turned on by an output 150 that indicates a specific type of use of data retaining device 12a. For example, in the case that data retaining device 12a is selected to be used for a "WRITE", signal 130 turns on all transistors 122 because data retaining device 12a is selected for a use, and output 150a turns on transistor 124a as the type of use is a "WRITE", which triggers/enables a charging of capacitor 20a by weighted charge source 110a. Similarly, a "READ" action of data retaining device 12a will charge capacitor 20a by weighted charge source 110b; and an "ACCESS" action will charge capacitor 20a by weighted charge source 110c.

According to one embodiment, a use of data retaining device 12a may be assigned with a priority over other types of uses of the same. For example, the amount of charges injected onto capacitors 20a through weighted charge source 110a, which is related to "WRITE", may be adjusted/controlled according to a certain policy, e.g., improving performance of data retaining sub-system 11. The three actions mentioned above, i.e., "WRITE", "READ", and "ACCESS", each may require different cost of resources for reloading and have a different impact on the performance of data retaining sub-system 11 (FIG. 1). Charges injected onto capacitor 20a for each of the three types of uses may be controlled to reflect the differences in the cost of resources. For instance, when a "WRITE" is performed to data retaining device 12a (FIG. 1) that is not already located in data retaining sub-system 11, e.g., a multi-port cache, it may be controlled such that a larger amount of charges are injected into capacitor 20a to reflect the performance loss of refetching that data from a memory, if the data is flushed and later refetched from the memory. The larger amount of charges make capacitor 20a age/decay more slowly than, for example, data that has been recently fetched from the memory, since the latter is not "dirty" and does not need to be flushed back to memory. In this manner, a higher temporal weighting may be assigned to a "dirty" cache line/port, here 12a (FIG. 1). In addition, it may also be controlled that the amount of charges injected onto capacitor 20a for each different type of action, e.g., "WRITE", "READ" and "ACCESS", is different. For example, a higher temporal weighting may be assigned to a "READ" action over "WRITE" or "ACCESS" actions.

Various methods may be used to adjust/control the charges injected onto capacitor 20a, and all are included in the current disclosure. For example, the size of weighted charge sources 110 may be tuned to differentiate the charges injected onto capacitor 20a by each of them. For another embodiment, sizes of transistor stacks 120 may also be tuned to channel different amount of charges to capacitor 20a for different uses. It should be appreciated that the various methods of controlling/adjusting charges injected onto capacitor 20a may be used alone or in various combinations, which are all included in the current disclosure.

As has been described above, the operation of system 10 (FIG. 1), including the hardware implementation 100 (FIG. 2), may be controlled by computer system 200. Details of computer system 200 will be described below.

2. Computer System

Figure 3:
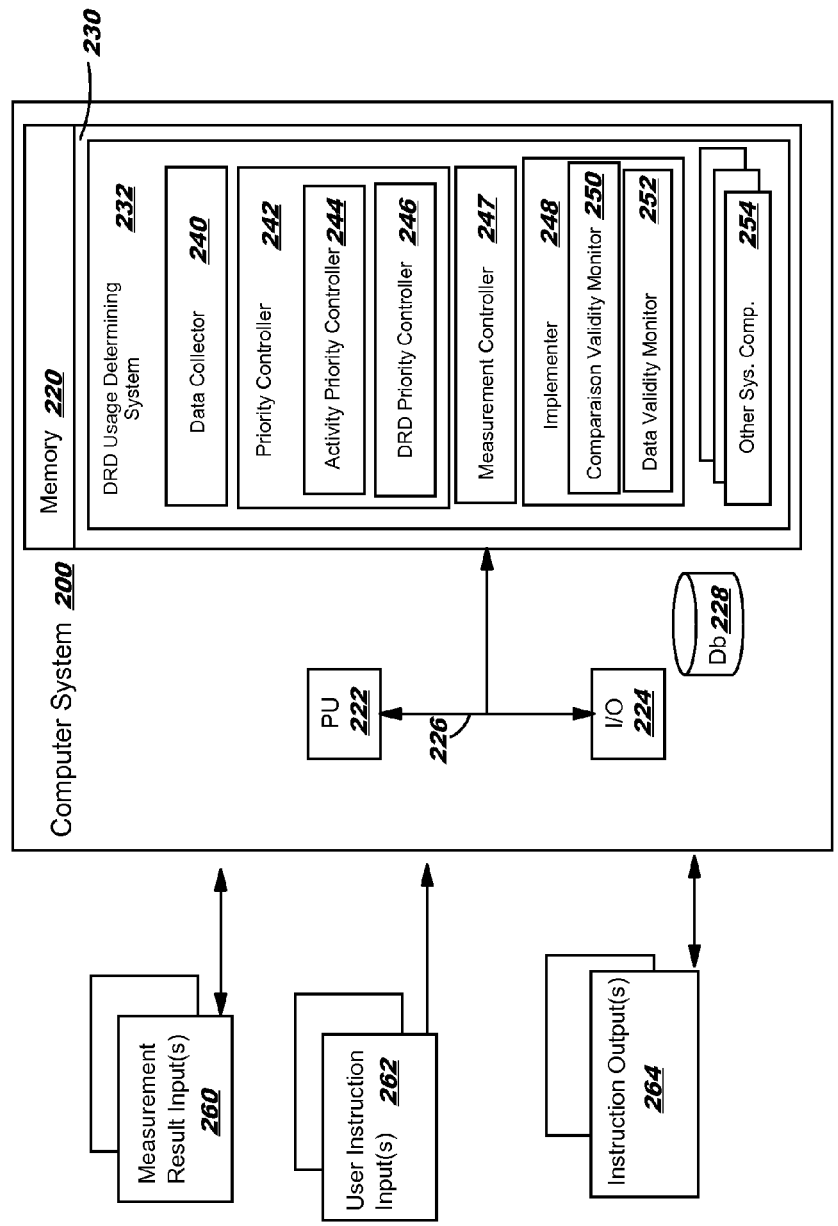
FIG. 3 shows a block diagram of an illustrative computer system according to one embodiment of the disclosure.

FIG. 3 shows a block diagram of an illustrative computer system 200 according to one embodiment of the disclosure. In one embodiment, computer system 200 includes a memory 220, a processing unit (PU) 222, input/output devices (I/O) 224 and a bus 226. A database 228 may also be provided for storage of data relative to processing tasks. Memory 220 includes a program product 230 that, when executed by PU 222, comprises various functional capabilities described in further detail below. Memory 220 (and database 228) may comprise any known type of data storage system and/or transmission media, including magnetic media, optical media, random access memory (RAM), read only memory (ROM), a data object, etc. Moreover, memory 220 (and database 228) may reside at a single physical location comprising one or more types of data storage, or be distributed across a plurality of physical systems. PU 222 may likewise comprise a single processing unit, or a plurality of processing units distributed across one or more locations. I/O 224 may comprise any known type of input/output device including a network system, modem, keyboard, mouse, scanner, voice recognition system, CRT, printer, disc drives, etc. Additional components, such as cache memory, communication systems, system software, etc., may also be incorporated into computer system 200.

As shown in FIG. 3, program product 230 may include a data retaining device (DRD) usage determining system 232 that includes a data collector 240; a priority controller 242 including an activity priority controller 244 and a data retaining device (DRD) priority controller 246; a measurement controller 247; an implementer 248 including a comparison validity monitor 250 and a data validity monitor 252; and other system components 254. Other system components 254 may include any now known or later developed parts of a computer system 200 not individually delineated herein, but understood by those skilled in the art.

Inputs to computer system 200 include measurement result inputs 260 and user instruction inputs 262. Measurement result inputs 260 include measurement results of measuring device 27 (FIG. 1) regarding, e.g., a voltage of a capacitor 20 and/or a comparison result of comparator 26 (FIG. 1). User instruction inputs 262 include instructions of a user of computer system 200 regarding the operation of, inter alia, DRD usage determining system 232. For example, a user may instruct priority controller 242 with respect to a priority of a data retaining device 12 and a priority of a specific type of use ("WRITE", "READ", or "ACCESS") of the data retaining device 12. These inputs may be obtained by data collector 240, and may be saved in database 228. Outputs of computer system 200 include instruction outputs 264 that are communicated to, inter alia, data retaining sub-system 11 to perform an action on a data retaining device 12, e.g., to refresh a data retaining device 12 (FIG. 1).

Figure 4:
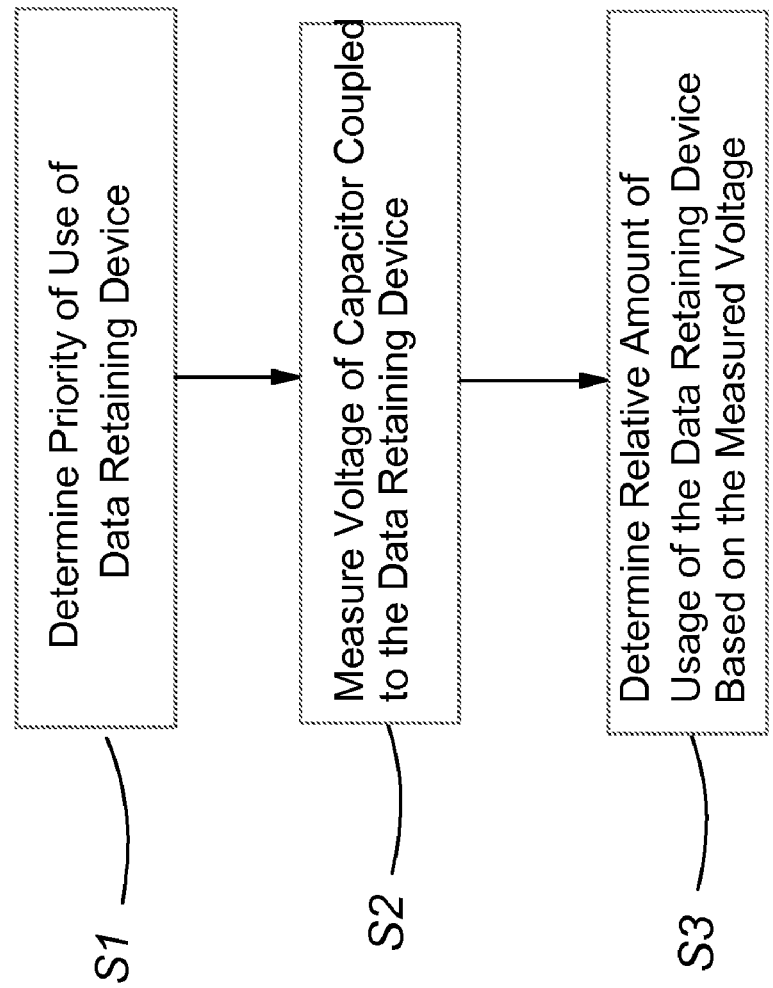
FIG. 4 shows a flow diagram of an operation of a data retaining device usage determining system according to one embodiment of the disclosure.

FIG. 4 shows a flow diagram of an operation of data retaining device usage determining system 232 according to one embodiment of the disclosure. Referring to FIGS. 1-4, in process S1, priority controller 242 determines a priority of a use of a data retaining device 12. Specifically, data retaining device (DRD) priority controller 246 determines a priority of a data retaining device, e.g., 12a, over other data retaining device, e.g., 12b. Activity priority controller 244 determines a priority of a type of use of data retaining device 12a, e.g., a "WRITE", over other types of use, e.g., "READ" or "ACCESS". Various standards or policies may be used in determining priorities of a data retaining device 12 or a type of use of the data retaining device 12, and are all included in the current disclosure. For example, improving performance of data retaining sub-system 11 may be a policy in determining a priority. As described above, various methods may be used to implement a priority determined by priority controller 242, and are all included in the current disclosure.

Next in process S2, measurement controller 247 controls a measurement of a voltage of a capacitor 20. Any means to measure a voltage of a capacitor 20 may be used with the disclosure and controlled by measurement controller 247. The results of the measurements may be communicated to computer system 200 through measurement result inputs 260 and may be obtained by data collector 240. In addition, results of the comparisons made in comparator 26 may also be communicated to computer system 200 and obtained by data collector 240.

Next in process S3, implementer 248 determines a relative amount of usage of a data retaining device 12 based on the measured voltage of the related/coupled capacitor 20, and determines an action upon the data retaining device 12 based on the usage determination, which may be implemented by data retaining sub-system 11. As described above, a lower voltage of a capacitor 20, e.g., 20a, indicates that the related data retaining device 12a has been used less then other data retaining devices, e.g., 12b. (FIG. 1). On the other hand, a higher voltage of capacitor 20a indicates that data retaining device 12a has been used more then data retaining devices 12b. Based on the determined relative amount of usage of data retaining device 12a, an action upon data retaining device 12a may be determined by implementer 248. For example, in the case that data retaining sub-system 11 needs to refresh some of the data retaining devices 12, implementer 248 may determine that a data retaining device 12 with a lower relative amount of usage be chosen to be refreshed.

According to an alternative embodiment, implementer 248 may compare a measured voltage of a capacitor 20, e.g., 20a, with a preset threshold, e.g., a minimum voltage value. If the measured voltage of capacitor 20a meets the threshold, e.g., lower than the minimum voltage value, the related data retaining device 12a is selected to be taken action upon, e.g., to be refreshed.

In addition, in process S3, comparison validity monitor 250 may optionally monitor whether a measured voltage of a capacitor 20 is valid to indicate a relative amount of usage of data retaining device 12. Specifically, comparison validity monitor 250 may control a signal 30 to represent an upper level threshold and a lower level threshold to be compared with a voltage of a capacitor 20, here e.g., 20a. If the voltage of capacitor 20a is lower than the upper level threshold and is higher than the lower level threshold, the voltage is considered valid to indicate a relative amount of usage of data retaining device 12a. If voltage of capacitor 20a is higher than the upper level threshold, or lower than the lower level threshold, voltage of capacitor 20a is considered invalid to indicate a relative amount of usage of data retaining device 12a. In addition, in the case that a comparison in comparator 26 does not generate a valid result, e.g., voltages of two capacitors 20 are the same, comparison validity monitor 150 may determine selecting a data retaining device 12 to take action upon based on other tests, e.g., a policy.

Moreover, data validity monitor 252 may optionally perform a data validity check. Specifically, data validity monitor 252 may determine whether a data in a data retaining device 12, e.g., 12a, is valid by comparing a voltage of the related capacitor 20a to a threshold which represents the minimum voltage of capacitor 20a to indicate that the data in data retaining device 12a is valid. Specifically, data validity monitor 252 may control signal 30a (FIG. 1) to represent a least positive up-level (LPUL) voltage and/or a most positive down-level (MPDL) voltage of comparator 20a to be compared with the voltage of capacitor 20a in comparator 28a. If voltage of capacitor 20a is lower than the LPUL voltage and/or the MPDL voltage, data in data retaining device 12a may be considered invalid and needs to be removed without consideration of the relative amount of usage of data retaining device 12a.

A complete integrated circuit including circuit 10 and/or 100, which may be referred to herein as a design structure, is created in a graphical computer programming language, and coded as a set of instructions on machine readable removable or hard media (e.g., residing on a graphical design system (GDS) storage medium). That is, design structure(s) is embodied in a machine readable medium used in a design process. (The design structure(s) may interface with any part of a machine readable media). The design structure(s) may include a netlist, which describes circuit 10 and/or 100, and may include test data files, characterization data, verification data, or design specifications. If the designer does not fabricate chips or the photolithographic masks used to fabricate chips, the designer transmits the resulting design structure by physical means (e.g., by providing a copy of the storage medium storing the design) or electronically (e.g., through the Internet) to such entities as a foundry, directly or indirectly. The stored design is then converted into the appropriate format (e.g., graphic design system 11 (GDSII)) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Figure 5:
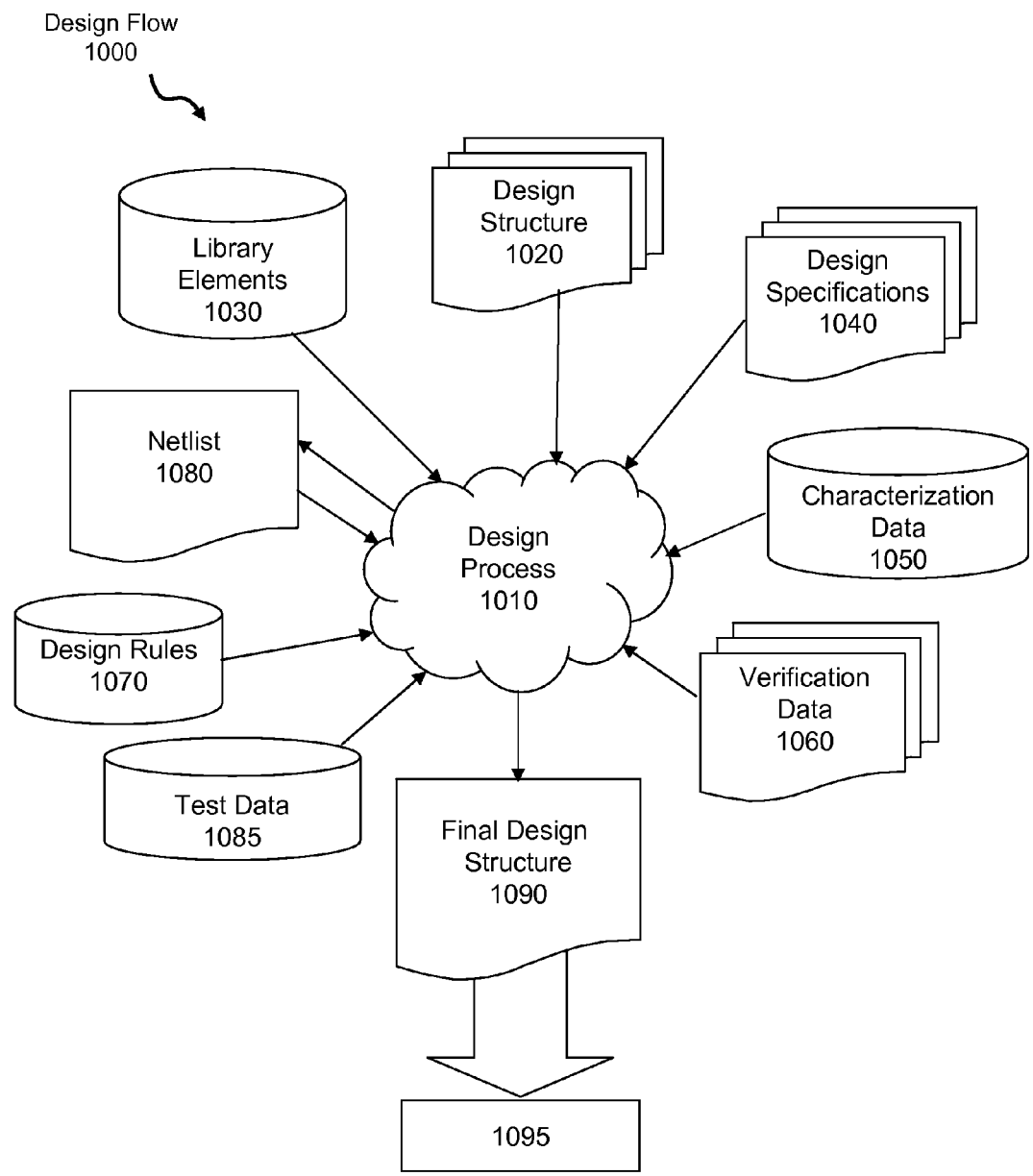
FIG. 5 depicts a block diagram of an exemplary design flow.

FIG. 5 depicts a block diagram of an example design flow 1000, which may vary depending on the type of IC being designed. For example, a design flow 1000 for building an application specific IC (ASIC) will differ from a design flow 1000 for designing a standard component. A design structure 1020 is an input to a design process 1010 and may come from an IP provider, a core developer, or other design company. The design structure 1020 comprises a circuit, e.g., circuits 10, 100, in the form of schematics or HDL, a hardware-description language, (e.g., Verilog, VHDL, C, etc.). The design structure 1020 may be on one or more of machine readable medium, e.g., memory 220 as shown in FIG. 3. For example, the design structure 1020 may be a text file or a graphical representation of circuit 10 and/or 100. The design process 1010 synthesizes (or translates) the circuits 10, 100 into a netlist 1080, where the netlist 1080 is, for example, a list of fat wires, transistors, logic gates, control circuits, I/O, models, etc., and describes the connections to other elements and circuits in an integrated circuit design and recorded on at least one machine readable medium 220.

The design process 1010 includes using a variety of inputs; for example, inputs from library elements 1030 which may house a set of commonly used elements, circuits, and devices, including models, layouts, and symbolic representations, for a given manufacturing technology (e.g., different technology nodes, 32 nm, 45 nm, 90 nm, etc.), design specifications 1040, characterization data 1050, verification data 1060, design rules 1070, and test data files 1085, which may include test patterns and other testing information. The design process 1010 further includes, for example, standard circuit design processes such as timing analysis, verification tools, design rule checkers, place and route tools, etc. One of ordinary skill in the art of integrated circuit design can appreciate the extent of possible electronic design automation tools and applications used in design process 1010 without deviating from the scope and spirit of the disclosure.

Ultimately, the design process 1010 translates the circuit 10 and/or 100 along with the rest of the integrated circuit design (if applicable), into a final design structure 1090 (e.g., information stored in a GDS storage medium). The final design structure 1090 may comprise information such as, for example, test data files, design content files, manufacturing data, layout parameters, wires, levels of metal, vias, shapes, test data, data for routing through the manufacturing line, and any other data required by a semiconductor manufacturer to produce circuit 10 and/or 100. The final design structure 1090 may then proceed to a stage 1095 of design flow 1000; where stage 1095 is, for example, where final design structure 1090: proceeds to tape-out, is released to manufacturing, is sent to another design house or is sent back to the customer.

3. Conclusion

While shown and described herein as a method and system for determining a relative amount of usage of a data retaining device, it is understood that the disclosure further provides various alternative embodiments. For example, in one embodiment, the disclosure provides a program product stored on a computer-readable medium, which when executed, enables a computer infrastructure to determine a relative amount of usage of a data retaining device. To this extent, the computer-readable medium includes program code, such as data retaining device usage determining system 232 (FIG. 3), which implements the process described herein. It is understood that the term "computer-readable medium" comprises one or more of any type of physical embodiment of the program code. In particular, the computer-readable medium can comprise program code embodied on one or more portable storage articles of manufacture (e.g., a compact disc, a magnetic disk, a tape, etc.), on one or more data storage portions of a computing device, such as memory 220 (FIG. 3) and/or database 228 (FIG. 3), and/or as a data signal traveling over a network (e.g., during a wired/wireless electronic distribution of the program product).

In another embodiment, the disclosure provides a method of generating a system for determining a relative amount of usage of a data retaining device. In this case, a computer infrastructure, such as computer system 200 (FIG. 3), can be obtained (e.g., created, maintained, having made available to, etc.) and one or more systems for performing the process described herein can be obtained (e.g., created, purchased, used, modified, etc.) and deployed to the computer infrastructure. To this extent, the deployment of each system can comprise one or more of: (1) installing program code on a computing device, such as computing system 200 (FIG. 3), from a computer-readable medium; (2) adding one or more computing devices to the computer infrastructure; and (3) incorporating and/or modifying one or more existing systems of the computer infrastructure, to enable the computer infrastructure to perform the process processes of the disclosure.

In still another embodiment, the disclosure provides a business method that performs the process described herein on a subscription, advertising supported, and/or fee basis. That is, a service provider could offer to determine a relative amount of usage of a data retaining device as described herein. In this case, the service provider can manage (e.g., create, maintain, support, etc.) a computer infrastructure, such as computer system 200 (FIG. 3), that performs the process described herein for one or more customers and communicates the results of the determination of the relative amount of usage of a data retaining device to the one or more customers. In return, the service provider can receive payment from the customer(s) under a subscription and/or fee agreement and/or the service provider can receive payment from the sale of advertising to one or more third parties.

As used herein, it is understood that the terms "program code" and "computer program code" are synonymous and mean any expression, in any language, code or notation, of a set of instructions that cause a computing device having an information processing capability to perform a particular function either directly or after any combination of the following: (a) conversion to another language, code or notation; (b) reproduction in a different material form; and/or (c) decompression. To this extent, program code can be embodied as one or more types of program products, such as an application/software program, component software/a library of functions, an operating system, a basic I/O system/driver for a particular computing and/or I/O device, and the like. Further, it is understood that the terms "component" and "system" are synonymous as used herein and represent any combination of hardware and/or software capable of performing some function(s).

The flowcharts and block diagrams in the Figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems which perform the specified functions or acts, or combinations of special purpose hardware and computer instructions.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, processes, operations, elements, and/or components, but do not preclude the presence or addition of one or more other features, integers, processes, operations, elements, components, and/or groups thereof.

Although specific embodiments have been illustrated and described herein, those of ordinary skill in the art appreciate that any arrangement which is calculated to achieve the same purpose may be substituted for the specific embodiments shown and that the disclosure has other applications in other environments. This application is intended to cover any adaptations or variations of the present disclosure. The following claims are in no way intended to limit the scope of the disclosure to the specific embodiments described herein.

What is claimed is:

1. A design structure embodied in a machine readable storage device used in a design flow process, the design structure comprising a circuit, the circuit comprising:
    a data retaining device;
    a charge storing device coupled to the data retaining device that a use of the data retaining device triggers a charging of the charge storing device by a charge source; and
    means for measuring a potential of the charge storing device, the measuring means being communicatively coupled to a calculating mean which determines a relative amount of usage of the data retaining device based on the measured potential, wherein the charge storing device is coupled to the charge source through a transistor stack including a first transistor and a second transistor, the first transistor being designed to be turned on by a first signal that is activated when the data retaining device is selected for a use, and the second transistor being designed to be turned on by a second signal that indicates a type of use of the data retaining device.

2. The design structure of claim 1, wherein the circuit further comprises a comparator that compares the measured potential with at least one of:
    a potential of a second charge storing device coupled to a second data retaining device; or
    a preset threshold.

3. An integrated circuit comprising:
    a data retaining device;
    a charge storing device coupled to the data retaining device that a use of the data retaining device triggers a charging of the charge storing device by a charge source; and
    means for measuring a potential of the charge storing device, the measuring means being communicatively coupled to a calculating mean which determines a relative amount of usage of the data retaining device based on the measured potential, wherein the charge storing device is coupled to the charge source through a transistor stack including a first transistor and a second transistor, the first transistor being designed to be turned on by a first signal that is activated when the data retaining device is selected for a use, and the second transistor being designed to be turned on by a second signal that indicates a type of use of the data retaining device.

* * * * *